US009011666B2

(12) United States Patent
Roeger-Goepfert et al.

(10) Patent No.: US 9,011,666 B2
(45) Date of Patent: Apr. 21, 2015

(54) COMPOSITION FOR METAL ELECTROPLATING COMPRISING LEVELING AGENT

(75) Inventors: Cornelia Roeger-Goepfert, Schwetzingen (DE); Roman Benedikt Raether, Speyer (DE); Sophia Ebert, Mannheim (DE); Charlotte Emnet, Stuttgart (DE); Alexandra Haag, Hemhofen (DE); Dieter Mayer, Darmstadt (DE)

(73) Assignee: BASF SE, Ludwigshafen (DE)

( * ) Notice: Subject to any disclaimer, the term of this patent is extended or adjusted under 35 U.S.C. 154(b) by 918 days.

(21) Appl. No.: 13/140,712

(22) PCT Filed: Dec. 8, 2009

(86) PCT No.: PCT/EP2009/066581
§ 371 (c)(1),
(2), (4) Date: Aug. 18, 2011

(87) PCT Pub. No.: WO2010/069810
PCT Pub. Date: Jun. 24, 2010

(65) Prior Publication Data
US 2011/0290659 A1  Dec. 1, 2011

(30) Foreign Application Priority Data

Dec. 19, 2008 (EP) .................... 08172330

(51) Int. Cl.
*C25D 3/38*  (2006.01)
*C08G 73/02*  (2006.01)
(Continued)

(52) U.S. Cl.
CPC .............. *C08G 73/024* (2013.01); *C08L 79/02* (2013.01); *C25D 3/38* (2013.01); *H01L 21/2885* (2013.01); *H01L 21/76877* (2013.01); *C25D 3/02* (2013.01); *H05K 3/423* (2013.01)

(58) Field of Classification Search
CPC .............. C25D 3/02; C25D 3/38; C25D 3/40; C25D 5/02; C08G 73/024; C08G 79/08
USPC .................................. 205/291, 297, 125, 296
See application file for complete search history.

(56) References Cited

U.S. PATENT DOCUMENTS 2,407,895 A    9/1946  Monson et al.
4,110,176 A *  8/1978  Creutz et al. ............. 205/296
(Continued)

FOREIGN PATENT DOCUMENTS

DE     102 43 361     4/2004
EP     0 057 398      8/1982
(Continued)

OTHER PUBLICATIONS

Fessenden et al, "Organic Chemistry", 6th Edition, Brooks/Cole Publishing Company, 1998, pp. 730-731.*

(Continued)

*Primary Examiner* — Edna Wong
*Assistant Examiner* — Louis Rufo
(74) *Attorney, Agent, or Firm* — Oblon, McClelland, Maier & Neustadt, L.L.P.

(57) ABSTRACT

A composition comprising a source of metal ions and at least one leveling agent obtainable by condensing at least one trialkanolamine of the general formula $N(R^1-OH)_3$ (Ia) and/or at least one dialkanolamine of the general formula $R^2-N(R^1-OH)_2$ (Ib) to give a polyalkanolamine(II), wherein the $R^1$ radicals are each independently selected from a divalent, linear or branched aliphatic hydrocarbon radical having from 2 to 6 carbon atoms, and the $R^2$ radicals are each selected from hydrogen and linear or branched aliphatic, cycloaliphatic and aromatic hydrocarbon radicals having from 1 to 30 carbon atoms, or derivatives obtainable by alkoxylation, substitution or alkoxylation and substitution of said polyalkanolamine (II).

20 Claims, 5 Drawing Sheets

(51) Int. Cl.
*C08L 79/02* (2006.01)
*H01L 21/288* (2006.01)
*H01L 21/768* (2006.01)
*C25D 3/02* (2006.01)
*H05K 3/42* (2006.01)

(56) References Cited

U.S. PATENT DOCUMENTS

| | | | |
|---|---|---|---|
| 4,505,839 A | | 3/1985 | Bellos et al. |
| 5,393,463 A | * | 2/1995 | Fikentscher et al. .......... 516/180 |
| 6,024,857 A | | 2/2000 | Reid |
| 6,425,996 B1 | | 7/2002 | Dahms et al. |
| 6,610,192 B1 | | 8/2003 | Step et al. |
| 2003/0168343 A1 | | 9/2003 | Commander et al. |
| 2004/0094511 A1 | * | 5/2004 | Seo et al. ........................ 216/83 |
| 2004/0187731 A1 | | 9/2004 | Wang et al. |
| 2010/0234631 A1 | | 9/2010 | Misske et al. |

FOREIGN PATENT DOCUMENTS

| | | |
|---|---|---|
| EP | 0 160 872 | 11/1985 |
| EP | 0 441 198 | 8/1991 |
| EP | 1 371 757 | 12/2003 |
| EP | 1 619 274 | 1/2006 |

OTHER PUBLICATIONS

U.S. Appl. No. 13/634,140, filed Sep. 11, 2012, Roeger-Goepfert, et al.
U.S. Appl. No. 13/177,042, filed Jul. 6, 2011, Grabarse, et al.
European Search Report Issued Apr. 24, 2009 in European Patent Application No. 08172330.6 filed Dec. 19, 2008.
International Search Report Issued Mar. 3, 2010 in PCT/EP09/066581 filed Dec. 8, 2009.
U.S. Appl. No. 13/510,328, filed May 17, 2012, Roeger-Goepfert, et al.

* cited by examiner

US 9,011,666 B2

COMPOSITION FOR METAL ELECTROPLATING COMPRISING LEVELING AGENT

CROSS-REFERENCE TO RELATED APPLICATIONS

The present application is a 35 U.S.C. §371 national stage patent application of International patent application PCT/EP09/066581, filed on Dec. 8, 2009, the text of which is incorporated by reference, and claims the benefit of the filing date of EP 08172330.6, filed on Dec. 19, 2008, the text of which is also incorporated by reference.

STATEMENT REGARDING FEDERALLY SPONSORED RESEARCH OR DEVELOPMENT

Not Applicable.

THE NAMES OF THE PARTIES TO A JOINT RESEARCH AGREEMENT

Not Applicable.

INCORPORATION-BY-REFERENCE OF THE MATERIAL ON THE COMPACT DISC

Not Applicable.

BACKGROUND OF THE INVENTION

1. Field of the Invention

The present invention relates to a composition for metal electroplating comprising a leveling agent.

2. Description of the Related Art Including Information Disclosed Under 37 CFR 1.97 and 1.98

Filling of small features, such as vias and trenches, by copper electroplating is an essential part of the semiconductor manufacture process. It is well known, that the presence of organic substances as additives in the electroplating bath can be crucial in achieving a uniform metal deposit on a substrate surface and in avoiding defects, such as voids and seams, within the copper lines.

One class of additives are the so-called levelers. Levelers are used to provide a substantially planar surface over the filled features. In literature, a variety of different leveling compounds has been described. In most cases, leveling compounds are N-containing and optionally substituted and/or quaternized polymers, such as polyethylene imine, polyglycine, poly(allylamine), polyaniline (sulfonated), polyurea, polyacrylamide, poly(melamine-co-formaldehyde) (US 2004/0187731), reaction products of amines with epichlorohydrin (U.S. Pat. No. 6,610,192), reaction products of an amine, epichlorohydrin, and polyalkylene oxide (EP 1 371 757 A1), reaction products of an amine with a polyepoxide (EP 1 619 274 A2), polyvinylpyridine, polyvinylimidazole (US 2003/0168343 A1), and polyvinylpyrrolidone (U.S. Pat. No. 6,024,857).

However, none of the documents cited discloses the use of polyalkanolamines, alkoxylated polyalkanolamines, functionalized polyalkanolamines, or functionalized alkoxylated polyalkanolamines as additives for copper electroplating baths.

Polyalkanolamines can be synthesized by condensation of alkanolamines in the presence of an acidic or basic catalyst or metal salt as described in U.S. Pat. No. 2,407,895, EP 0 441 198 or U.S. Pat. No. 5,393,463. A co-condensation of alkanolamines with other hydroxyl-containing molecules like pentaerythritol, sorbitol, glycol, glycerol has been described in EP 0 057 398. The functionalization, i.e. quaternization of nitrogen atoms, of polydialkanolamines is described in EP-A-0057398 and EP-A-0160872.

European patent application No. 07120393.9, which was yet to be published at the priority date of the present application, discloses alkoxylated polyalkanolamines. They are prepared by means of a two-stage process in which, in a first step, amino alcohols are condensed to give polyalkanolamines, and the resulting polyalkanolamines are optionally alkoxylated in a second step. Functionalized alkoxylated polyalkanolamines are disclosed in the same application as well.

BRIEF SUMMARY OF THE INVENTION

It is an object of the present invention to provide a copper electroplating additive having good leveling properties, in particular leveling agents capable of providing a substantially planar copper layer and filling features on the nanometer and on the micrometer scale without substantially forming defects, such as but not limited to voids, with a metal electroplating bath, preferably a copper electroplating bath.

It has been found, that polyalkanolamines, alkoxylated polyalkanolamines, functionalized polyalkanolamines, and functionalized alkoxylated polyalkanolamines can be used as levelling additives in copper electroplating baths.

Therefore the present invention provides a composition comprising a source of metal ions and at least one additive obtainable by condensing at least one trialkanolamine of the general formula $N(R^1—OH)_3$ (Ia) and/or at least one dialkanolamine of the general formula $R^2—N(R^1—OH)_2$ (Ib) to give a polyalkanolamine(II), wherein the $R^1$ radicals are each independently selected from a divalent, linear or branched aliphatic hydrocarbon radical having from 2 to 6 carbon atoms, and the $R^2$ radicals are each selected from hydrogen and aliphatic, cycloaliphatic and aromatic hydrocarbon radicals, all of which may be linear or branched, having from 1 to 30 carbon atoms, or derivatives obtainable by alkoxylation, substitution or alkoxylation and substitution of said polyalkanolamine(II).

It has been found that the use of compositions according to the present invention for electroplating provides deposited metal layers, particularly copper layers, having reduced overplating, particularly reduced mounding. The metal layers provided by the present invention are substantially planar, even on substrates exhibiting apertures of a very wide range of different aperture sizes (scale: ≤130 nm to 2 µm). Furthermore it has been found that the present invention provides metal layers substantially without the formation of added defects, such as voids, in the features.

A further significant advantage of this leveling effect is that less material has to be removed in post-deposition operations. For example, chemical mechanical polishing (CMP) is used to reveal the underlying features. The more level deposit of the invention corresponds to a reduction in the amount of metal which must be deposited, therefore resulting in less removal later by CMP. There is a reduction in the amount of scrapped metal and, more significantly, a reduction in the time required for the CMP operation. The material removal operation is also less severe which, coupled with the reduced duration, corresponds to a reduction in the tendency of the material removal operation to impart defects.

Preferably the metal ions comprise copper ions.

A preferred additive is an alkoxylated polyalkanolamine obtainable by alkoxylating the resulting polyalkanolamine (II) with $C_2$- to $C_{12}$-alkylene oxides, styrene oxide, glycidol, or glycidyl ethers. It is particularly preferred to select the alkylene oxides from ethylene oxide, propylene oxide, butylene oxide or combinations thereof.

Preferably the degree of alkoxylation is from 0.1 to 200, in particular from 0.5 to 20.

Preferably the substitution is a quaternization, protonation, alkylation sulphatation, phosphatation or combinations thereof.

A preferred additive is obtainable by co-condensing a compound selected from N-hydroxyalkylamines of formulae (Ia) and (Ib) with at least one compound (Ic) comprising two hydroxyl groups or two amino groups or a hydroxyl and an amino group. It is particularly preferred that the at least one compound (Ic) is present in an amount of not more than 50% by weight based on the amount of all components used for condensation.

The polyalkylene oxide chains may preferably have block, random or gradient structure or combinations thereof. "Gradient structure" means that there is a gradient in the ratio of the at least two alkylene oxides during polyalkoxylation of the polyalkanolamine with the result that there will also be a gradient in the ratio of the at least to alkylene oxides present in the polyalkylen oxide chain.

In a preferred embodiment the trialkanolamine (la) is at least one trialkanolamine selected from the group of triethanolamine, triisopropanolamine and tributan-2-olamine.

The metal electroplating composition may further comprise an accelerating agent. Independently or in addition it may comprise a suppressing agent.

A further embodiment of the present invention is the use of polyalkanolamines or derivatives obtainable by alkoxylation, substitution or alkoxylation and substitution thereof in a bath for metal electroplating, wherein the polyalkanolamines are obtainable by condensing at least one trialkanolamine of the general formula $N(R^1\text{—}OH)_3$ (Ia) and/or at least one dialkanolamine of the general formula $R^2\text{—}N(R^1\text{—}OH)_2$ (Ib) to give a polyalkanolamine(II), wherein the $R^1$ radicals are each independently selected from a divalent, linear or branched aliphatic hydrocarbon radical having from 2 to 6 carbon atoms, and the $R^2$ radicals are each selected from hydrogen and linear or branched aliphatic, cycloaliphatic and aromatic hydrocarbon radicals having from 1 to 30 carbon atoms.

Yet another embodiment of the present invention is a process for depositing a metal layer on a substrate by contacting a plating solution as described above with the substrate, and applying a current to the substrate to deposit a metal layer onto the substrate. The process is particularly useful for depositing metal, particularly copper layers on substrate comprising micrometer or submicrometer-sized features. The micrometer or submicrometer-sized features preferably have a size from 10 to 1000 nm and/or an aspect ratio of 4 or more.

As used throughout the specification, "feature" refers to the geometries on a substrate, such as, but not limited to, trenches and vias. "Apertures" refer to recessed features, such as vias and trenches. As used throughout this specification, the term "plating" refers to metal electroplating, unless the context clearly indicates otherwise. "Deposition" and "plating" are used interchangeably throughout this specification. The term "alkyl" includes linear, branched and cyclic alkyl. "Accelerator" refers to an organic additive that increases the plating rate of the electroplating bath. The terms "accelerator" and "accelerating agent" are used interchangeably throughout this specification. In literature, sometimes the accelerator component is also named "brightener" or "brightening agent". "Suppressor" refers to an organic compound that decreases the plating rate of the electroplating bath. The terms "suppressors" and "suppressing agents" are used interchangeably throughout this specification. "Leveler" refers to an organic compound that is capable of providing a substantially planar metal layer. The terms "levelers", "leveling agents" and "leveling additive" are used interchangeably throughout this specification.

BRIEF DESCRIPTION OF THE SEVERAL VIEWS OF THE DRAWINGS

FIG. 1a: A dielectric substrate 1 seeded with a copper layer 2a.

DETAILED DESCRIPTION OF THE INVENTION

Figure 1A:
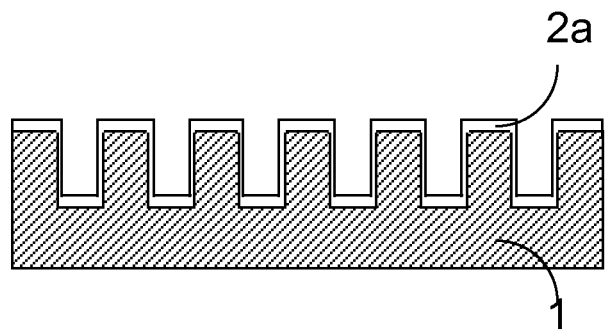

The present invention provides a plated metal layer, particularly a plated copper layer, on a substrate containing features on the nanometer and/or micrometer scale wherein the metal layer has reduced overplating and all features are substantially free of added voids, and preferably substantially free of voids. "Overplating" refers to a thicker metal deposit over dense feature areas as compared to areas free of features or at least containing relatively few features. "Dense feature areas" means an area exhibiting smaller distances between neighboring features compared to a comparative area containing apertures with a relatively large distance in between. Smaller distances means distances below 2 micrometer, and preferably below 1 micrometer, and even more preferably below 500 nm. Such difference in the plating thickness over dense feature areas as compared to the plating thickness over areas free of features or containing relatively few features is referred to as "step height" or "mounding".

Suitable substrates are any used in the manufacture of electronic devices, such as integrated circuits. Such substrates typically contain a number of features, particularly apertures, having a variety of sizes. Particularly suitable substrates are those having apertures on the nanometer and on the micrometer scale.

The present invention is achieved by combining one or more leveling agents capable of providing a substantially planar copper layer and filling features on the nanometer and on the micrometer scale without substantially forming defects, such as but not limited to voids, with a metal electroplating bath, preferably a copper electroplating bath. Suitable leveling agents are polyalkanolamine, alkoxylated polyalkanolamine, functionalized polyalkanolamine, or functionalized alkoxylated polyalkanolamine.

Polyalkanolamines can be obtained by condensing at least one trialkanolamine of the general formula $N(R^1—OH)_3$ (Ia) and/or at least one dialkanolamine of the general formula $R^2—N(R^1—OH)_2$ (Ib) to give a polyalkanolamine(II) (stage A), where the $R^1$ radicals are each independently selected from a divalent, linear and branched aliphatic hydrocarbon radical having from 2 to 6 carbon atoms, and the $R^2$ radicals are each selected from hydrogen and aliphatic, cycloaliphatic and aromatic hydrocarbon radicals, all of which may be linear or branched, having from 1 to 30 carbon atoms.

The alkanolamine can be used as such or may optionally be alkoxylated, functionalized or alkoxylated and functionalized to get alkoxylated polyalkanolamines (III), functionalized polyalkanolamines (IV) or functionalized alkoxylated polyalkanolamines (V).

Alkoxylated polyalkanolamines (III) can be obtained by alkoxylating polyalkanolamine (II) with $C_2$- to $C_{12}$-alkylene oxides, styrene oxide, glycidol, or glycidyl ethers with the proviso that the average degree of alkoxylation is from 0.1 to 200 per OH group and—where present—secondary amino group (stage B).

Functionalized polyalkanolamines (IV) can be obtained by functionalizing polyalkanolamine (II) with suitable functionalization reagents which are capable of reaction with hydroxyl groups and/or amino groups (stage C).

Functionalized alkoxylated polyalkanolamines (V) can be obtained by functionalizing alkoxylated polyalkanolamine (III) with suitable functionalization reagents which are capable of reaction with hydroxyl groups and/or amino groups (stage D).

The trialkanolamines (Ia) and/or dialkanolamines (Ib) used in stage (A) have the general formulae $N(R^1—OH)_3$ (Ia) and $R^2—N(R^1—OH)_2$ (Ib).

The $R^1$ radicals are in each case independently a divalent linear or branched aliphatic hydrocarbon radical having from 2 to 6 carbon atoms, preferably 2 or 3 carbon atoms. Examples of such radicals comprise ethane-1,2-diyl, propane-1,3-diyl, propane-1,2-diyl, 2-methylpropane-1,2-diyl, 2,2-dimethylpropane-1,3-diyl, butane-1,4-diyl, butane-1,3-diyl (=1-methylpropane-1,3-diyl), butane-1,2-diyl, butane-2,3-diyl, 2-methylbutane-1,3-diyl, 3-methylbutane-1,3-diyl (=1,1-dimethylpropane-1,3-diyl), pentane-1,4-diyl, pentane-1,5-diyl, pentane-2,5-diyl, 2-methylpentane-2,5-diyl (=1,1-dimethylbutane-1,3-diyl) and hexane-1,6-diyl. The radicals are preferably ethane-1,2-diyl, propane-1,3-diyl or propane-1,2-diyl.

The $R^2$ radical is hydrogen and/or linear or branched aliphatic, cycloaliphatic and/or aromatic hydrocarbon radicals having from 1 to 30 carbon atoms, preferably from 1 to 20 carbon atoms and more preferably from 1 to 10 carbon atoms. Aromatic radicals may of course also have aliphatic substituents. $R^2$ is preferably hydrogen or aliphatic hydrocarbon radicals having from 1 to 4 carbon atoms.

Examples of preferred trialkanolamines (Ia) comprise triethanolamine, triisopropanolamine and tributan-2-olamine, particular preference is given to triethanolamine.

Examples of preferred dialkanolamines (Ib) comprise diethanolamine, N-methyl-diethanolamine, N,N-bis(2-hydroxypropyl)-N-methylamine, N,N-bis(2-hydroxybutyl)-N-methylamine, N-isopropyldiethanolamine, N-n-butyldiethanolamine, N-sec-butyldiethanolamine, N-cyclohexyldiethanolamine, N-benzyldiethanolamine, N-4-tolyldiethanolamine or N,N-bis(2-hydroxyethyl)aniline. Particular preference is given to diethanolamine.

In addition to the trialkanolamines (Ia) and/or dialkanolamines (Ib) it is optionally possible to use further components (Ic) having two hydroxyl and/or amino groups for the polycondensation.

In a preferred embodiment, components (Ic) are polyols of the general formula $R^3(OH)_n$, where n is a natural number from 2 to 6 and $R^3$ is an n-valent linear or branched aliphatic, cycloaliphatic or aromatic hydrocarbon radical having from 2 to 10 carbon atoms.

Examples of such polyols comprise aliphatic polyols such as ethylene glycol, propylene glycol, butylene glycol, glycerol, tri(hydroxymethyl)ethane, tri(hydroxymethyl)propane, sorbitol, neopentyl glycol or pentaerythritol, cycloaliphatic polyols such as 1,4-dihydroxycyclohexane or arylaliphatic polyols such as 1,4-bis(hydroxymethyl)benzene.

In a further preferred embodiment, components (Ic) are polyamines of the general formula $R^4(NHR^5)_m$, where m is a natural number from 2 to 4, $R^4$ is an m-valent linear or branched aliphatic, cycloaliphatic or aromatic hydrocarbon radical having from 2 to 10 carbon atoms, and $R^5$ radicals are each independently H, a hydrocarbon radical as defined for $R^2$, where two $R^5$ radicals together may also be an alkylene group, preferably a linear 1,ω-alkylene group having from 2 to 6 carbon atoms. $R^5$ is preferably H or a methyl group.

Examples of such polyamines comprise ethylenediamine, N,N'-dimethylethylenediamine, N,N'-diethylethylenediamine, 1,2-diaminopropane, 1,3-diaminopropane, 1,6-diaminohexane, 1,2-diaminocyclohexane, 1,3-diaminocyclohexane, 1,4-diaminocyclohexane or piperazine.

Where present, the components (Ic) having at least two hydroxyl and/or amino groups are preferably used in an amount of not more than 50% by weight based on the total amount of all components used for the condensation, i.e. (Ia) and/or (Ib), (Ic) and, if appropriate, (Id).

In addition to components (Ia) and/or (Ib) and, if appropriate, (Ic), it is optionally also possible for further components (Id) other than (Ia), (Ib) or (Ic) to be used for the condensation. They may in principle be all mono- or polyfunctional compounds which have functional groups which can react in a condensation reaction with trialkanolamines (Ia) and/or dialkanolamines (Ib). The term "condensation" shall be understood here, in a customary manner, to mean a reaction in which two functional groups form one covalent bond with elimination of a small molecule, especially water. Examples of compounds (Id) comprise carboxylic acids, especially dicarboxylic acids, which can form ester groups with the trialkanolamines (Ia) and/or dialkanolamines (Ib). Such further components can be used for fine adjustment of the properties of the alkoxylated polyalkanolamines, used in accordance with the invention. The amount of such further compounds (Id) should, though, generally not exceed 5% by weight based on the amount of (Ia), (Ib), (Ic) and (Id). The amount is preferably less than 1% by weight, more preferably less than 0.5% by weight, and most preferably no further components (Id) are used for the condensation.

The polycondensation of components (Ia) and/or (Ib) and optionally (Ic) or (Id) can be carried out by methods known in principle to those skilled in the art while heating the components, with elimination of water. Suitable methods are disclosed, for example, by EP 441 198 A2. It will be appreciated that it is in each case also possible to use mixtures of different components (Ia), (Ib), (Ic) or (Id).

The condensation is performed typically at temperatures of from 120 to 280 degree C., preferably from 150 to 260 degree C. and more preferably from 180 to 240 degree C. The water formed is preferably distilled off. The reaction time is typically from 1 to 16 h, preferably from 2 to 8 h. The degree of condensation can be controlled in a simple manner through the reaction temperature and time.

The polycondensation is preferably carried out in the presence of an acid, preferably phosphorous acid ($H_3PO_3$) and/or hypophosphorous acid ($H_3PO_2$). Preferred amounts are from 0.05 to 2% by weight, preferably from 0.1 to 1% by weight, based on the components to be condensed. In addition to the acid, it is also possible to use additional catalysts, for example, zinc halides or aluminum sulfate, if appropriate in a mixture with acetic acid, as disclosed, for example by U.S. Pat. No. 4,505,839.

The viscosity of the resulting polyalkanolamines (II) is typically in the range from 1000 to 50 000 mPa·s, preferably from 2000 to 20 000 mPa·s and more preferably from 3000 to 13000 mPa·s (each measured on the undiluted product at 20 degree C.).

The mean molar mass $M_n$ (number average) of the resulting polyalkanolamines (II) is typically in the range from 250 to 50 000 g/mole, preferably from 500 to 40 000 g/mole, more preferably from 1000 to 20 000 g/mole and most preferably from 1000 to 7 500 g/mole.

The mean molar mass $M_w$ (weight average) of the resulting polyalkanolamines (II) is typically in the range from 250 to 50 000 g/mole, preferably from 500 to 30 000 g/mole, and most preferably from 1000 to 20 000 g/mole, 2000 to 10 000 g/mole.

The resulting polyalkanolamine (II) preferably has a polydispersity ($M_w/M_n$) in the range of 1 to 10, and in particular in the range of 1 to 5.

The polyalkanolamines (II) can optionally be alkoxylated in a second stage (B). In this step, the OH groups and any secondary amino groups present react with alkylene oxides to form terminal polyether groups.

It is possible to use $C_2$- to $C_{12}$-alkylene oxides, styrene oxide, glycidol, or glycidyl ethers such as glycidyl tert-butyl ether. Examples of corresponding alkylene oxides comprise ethylene oxide and propylene oxide and also 1-butene oxide, 2,3-butene oxide, 2-methyl-1,2-propene oxide (isobutene oxide), 1-pentene oxide, 2,3-pentene oxide, 2-methyl-1,2-butene oxide, 3-methyl-1,2-butene oxide, 2,3-hexene oxide, 3,4-hexene oxide, 2-methyl-1,2-pentene oxide, 2-ethyl-1,2-butene oxide, 3-methyl-1,2-pentene oxide, decene oxide, 4-methyl-1,2-pentene oxide or styrene oxide.

Preference is given to using ethylene oxide and/or propylene oxide and/or butylene oxide. Higher alkylene oxides are generally used, at most, in small amounts for fine adjustment of the properties. In general, the amount of ethylene oxide and/or propylene oxide and/or butylene oxide is at least 80% by weight, preferably 95% by weight and more preferably 95% by weight based on the sum of all alkylene oxides used.

The average degree of alkoxylation is from about 0.1 to about 200, preferably from about 0.1 to about 100, more preferably from about 0.1 to about 50, most preferably from about 0.5 to about 20 and, for example, 1 to 10 alkylene units per OH group and—where present—per secondary amino group in the starting material of the alkoxylation, i.e. the polyalkanolamine (II).

When two or more different alkylene oxides are used, the polyoxyalkylene groups formed may be random copolymers, gradient copolymers or block copolymers.

The synthesis of alkylene oxide units is known to those skilled in the art. Comprehensive details are given, for example, in "Polyoxyalkylenes" in Ullmann's Encyclopedia of Industrial Chemistry, 6th Edition, Electronic Release.

Preference is given to undertaking the alkoxylation in the presence of a customary basic catalyst, for example alkali metal hydroxides, preferably potassium hydroxide, or alkali metal alkoxides, for example, sodium methoxide or potassium tert-butylate. In addition, it is also possible to use double metal cyanide catalysts (DMC catalysts). Suitable DMC catalysts are disclosed, for example, in DE 102 43 361 A1, especially paragraphs [0029] to [0041] and the literature cited therein. The alkoxylation can be undertaken, in a manner known in principle, in a pressure reactor at from 40 to 250 degree C., preferably from 80 to 200 degree C. and more preferably from 100 to 150 degree C. For the correct metered addition of the alkylene oxides, it is advisable, before the alkoxylation, to determine the number of OH groups and if appropriate, the number of (secondary) amino groups of the polyalkanolamine (II).

Polyalkanolamines (II) can optionally be functionalized in a further reaction step (C). An additional functionalization can serve to modify the properties of the polyalkanolamines (II). To this end, the hydroxyl groups and/or amino groups present in the polyalkanolamines (II) are converted by means of suitable agents which are capable of reaction with hydroxyl groups and/or amino groups. This forms functionalized polyalkanolamines (IV).

For example, the tertiary amino groups present in the polyalkanolamine (II) can be protonated or quaternized by means of suitable alkylating agents. Examples for suitable alkylating agents are organic compounds which contain active halogen atoms, such as the aralkyl halides, the alkyl, alkenyl and alkynyl halides, and the like. Additionally, compounds such as the alkyl sulfates, alkyl sultones, epoxides, and the like may also be used. Examples of corresponding alkylating agents comprise benzyl chloride, propane sultone, dimethyl sulphate, (3-chloro-2-hydroxypropyl)trimethyl ammonium chloride, or the like. Preference is given to using dimethyl sulphate and/or benzyl chloride. Particularly dimethylsulfat.

The terminal hydroxyl groups of the polyalkanolamine can be reacted with suitable reagents for functionalization, which forms groups of the general formula -(alkoxy)$_n$—X where X is any desired group. The type of functionalization depends on the desired end use. According to the functionalizing agent, the chain end can be hydrophobized or more strongly hydrophilized.

The terminal hydroxyl groups can be esterified, for example, with sulfuric acid or derivatives thereof, so as to form products with terminal sulfate groups (sulphatation). Analogously, products having terminal phosphorus groups can be obtained with phosphoric acid, phosphorous acid, polyphosphoric acid, $POCl_3$ or $P_4O_{10}$ (phosphatation). In addition, the terminal OH groups may also be etherified, so as to form ether-terminated polyalkoxy groups of the general formula -(alkoxy)$_n$—O—R$^6$, where R$^6$ is an alkyl, alkenyl, alkynyl, alkaryl, or aryl group.

The alkoxylated polyalkanolamines (III) can optionally be functionalized in a further reaction step (D). An additional functionalization can serve to modify the properties of the alkoxylated polyalkanolamines (III). To this end, the hydroxyl groups and/or amino groups present in the alkoxylated polyalkanolamines (III) are converted by means of suitable agents which are capable of reaction with hydroxyl groups and/or amino groups. This forms functionalized alkoxylated polyalkanolamines (V).

For example, the tertiary amino groups present in the alkoxylated polyalkanolamine can be protonated or quaternized by means of suitable alkylating agents. Examples for suitable alkylating agents are organic compounds which contain active halogen atoms, such as the aralkyl halides, the alkyl, alkenyl and alkynyl halides, and the like. Additionally, compounds such as the alkyl sulfates, alkyl sultones, epoxides, and the like may also be used. Examples of corresponding alkylating agents comprise benzyl chloride, propane sultone, dimethyl sulphate, (3-chloro-2-hydroxypropyl) trimethyl ammonium chloride, or the like. Preference is given to using dimethyl sulphate and/or benzyl chloride.

The terminal hydroxyl groups of the alkoxylated polyalkanolamine can be reacted with suitable reagents for derivatization, which forms groups of the general formula -(alkoxy)$_n$ —X where X is any desired group. The type of functionalization depends on the desired end use. According to the functionalizing agent, the chain end can be hydrophobized or more strongly hydrophilized.

The terminal hydroxyl groups can be esterified, for example, with sulfuric acid or derivatives thereof, so as to form products with terminal sulfate groups. Analogously, products having terminal phosphorus groups can be obtained with phosphoric acid, phosphorous acid, polyphosphoric acid, $POCl_3$ or $P_4O_{10}$.

In addition, the terminal OH groups may also be etherified, so as to form ether-terminated polyalkoxy groups of the general formula -(alkoxy)$_n$—O—R$^6$, where R$^6$ is an alkyl, alkenyl, alkynyl, alkaryl, or aryl group.

The metal ion source may be any compound capable of releasing metal ions to be deposited in the electroplating bath in sufficient amount, i.e is at least partially soluble in the electroplating bath. It is preferred that the metal ion source is soluble in the plating bath. Suitable metal ion sources are metal salts and include, but are not limited to, metal sulfates, metal halides, metal acetates, metal nitrates, metal fluoroborates, metal alkylsulfonates, metal arylsulfonates, metal sulfamates, metal gluconates and the like. It is preferred that the metal is copper. It is further preferred that the source of metal ions is copper sulfate, copper chloride, copper acetate, copper citrate, copper nitrate, copper fluoroborate, copper methane sulfonate, copper phenyl sulfonate and copper p-toluene sulfonate. Copper sulfate pentahydrate and copper methane sulfonate are particularly preferred. Such metal salts are generally commercially available and may be used without further purification.

Besides metal electroplating the compositions may be used in electroless deposition of metal containing layers. The compositions may particularly used in the deposition of barrier layers containing Ni, Co, Mo, W and/or Re. In this case, besides metal ions, further elements of groups III and V, particularly B and P may be present in the composition for electroless deposition and thus co-deposited with the metals.

The metal ion source may be used in the present invention in any amount that provides sufficient metal ions for electroplating on a substrate. Suitable metal ion metal sources include, but are not limited to, tin salts, copper salts, and the like. When the metal is copper, the copper salt is typically present in an amount in the range of from about 1 to about 300 g/L of plating solution. It will be appreciated mixtures of metal salts may be electroplated according to the present invention. Thus, alloys, such as copper-tin having up to about 2 percent by weight tin, may be advantageously plated according to the present invention. The amounts of each of the metal salts in such mixtures depend upon the particular alloy to be plated and is well known to those skilled in the art.

In general, besides the metal ion source and at least one of the leveling agents (II) to (V), further referred to as polyalkanolamines, the present metal electroplating compositions preferably include electrolyte, i.e. acidic or alkaline electrolyte, one or more sources of metal ions, optionally halide ions, and optionally other additives like accelerators and/or suppressors. Such baths are typically aqueous. The water may be present in a wide range of amounts. Any type of water may be used, such as distilled, deionized or tap.

The electroplating baths of the present invention may be prepared by combining the components in any order. It is preferred that the inorganic components such as metal salts, water, electrolyte and optional halide ion source, are first added to the bath vessel followed by the organic components such as leveling agents, accelerators, suppressors, surfactants and the like.

Typically, the plating baths of the present invention may be used at any temperature from 10 to 65 degrees C. or higher. It is preferred that the temperature of the plating baths is from 10 to 35 degrees C. and more preferably from 15 degrees to 30 degrees C.

Suitable electrolytes include such as, but not limited to, sulfuric acid, acetic acid, fluoroboric acid, alkylsulfonic acids such as methanesulfonic acid, ethanesulfonic acid, propanesulfonic acid and trifluoromethane sulfonic acid, arylsulfonic acids such as phenyl sulfonic acid and toluenesulfonic acid, sulfamic acid, hydrochloric acid, phosphoric acid, tetraalkylammonium hydroxide, preferably tetramethylammonium hydroxide, sodium hydroxide, potassium hydroxide and the like. Acids are typically present in an amount in the range of from about 1 to about 300 g/L, alkaline electrolytes are typically present in an amount of about 0.1 to about 20 g/L or to yield a pH of 8 to 13 respectively, and more typically to yield a pH of 9 to 12.

Such electrolytes may optionally contain a source of halide ions, such as chloride ions as in copper chloride or hydrochloric acid. A wide range of halide ion concentrations may be used in the present invention such as from about 0 to about 500 ppm. Typically, the halide ion concentration is in the range of from about 10 to about 100 ppm based on the plating bath. It is preferred that the electrolyte is sulfuric acid or methanesulfonic acid, and preferably a mixture of sulfuric acid or methanesulfonic acid and a source of chloride ions. The acids and sources of halide ions useful in the present invention are generally commercially available and may be used without further purification.

The leveling agents according to the present invention are any which are capable of providing a substantially planar copper layer and filling small features without substantially forming voids and are polyalkanolamine, alkoxylated polyalkanolamine, functionalized polyalkanolamine, or functionalized alkoxylated polyalkanolamine. It will be appreciated by those skilled in the art that more than one leveling agent may be used. When two or more leveling agents are used, at least one of the leveling agents is a polyalkanolamine, alkoxylated polyalkanolamine, functionalized polyalkanolamine, or functionalized alkoxylated polyalkanolamine.

Suitable additional leveling agents include, but are not limited to, one or more of polyethylene imine and derivatives thereof, quaternized polyethylene imine, polyglycine, poly(allylamine), polyaniline, polyurea, polyacrylamide, poly(melamine-coformaldehyde), reaction products of amines with epichlorohydrin, reaction products of an amine, epichlorohydrin, and polyalkylene oxide, reaction products of an amine with a polyepoxide, polyvinylpyridine, polyvinylimidazole, polyvinylpyrrolidone, or copolymers thereof, nigrosines, pentamethyl-para-rosaniline hydrohalide, hexamethyl-pararosaniline hydrohalide, or compounds containing a functional group of the formula N—R—S, where R is a substituted alkyl, unsubstituted alkyl, substituted aryl or unsubstituted aryl. Typically, the alkyl groups are (C1-C6) alkyl and preferably (C1-C4)alkyl. In general, the aryl groups include (C6-C20)aryl, preferably (C6-C10)aryl. Such aryl groups may further include heteroatoms, such as sulfur, nitrogen and oxygen. It is preferred that the aryl group is phenyl or napthyl. The compounds containing a functional group of the formula N—R—S are generally known, are generally commercially available and may be used without further purification.

In such compounds containing the N—R—S functional group, the sulfur ("S") and/or the nitrogen ("N") may be attached to such compounds with single or double bonds. When the sulfur is attached to such compounds with a single bond, the sulfur will have another substituent group, such as but not limited to hydrogen, (C1-C12)alkyl, (C2-C12)alkenyl, (C6-C20)aryl, (C1-C12)alkylthio, (C2-C12)alkenylthio, (C6-C20)arylthio and the like. Likewise, the nitrogen will have one or more substituent groups, such as but not limited to hydrogen, (C1-C12)alkyl, (C2-C12)alkenyl, (C7-C10)aryl, and the like. The N—R—S functional group may be acyclic or cyclic. Compounds containing cyclic N—R—S functional groups include those having either the nitrogen or the sulfur or both the nitrogen and the sulfur within the ring system.

By "substituted alkyl" is meant that one or more of the hydrogens on the alkyl group is replaced with another substituent group, such as, but not limited to, cyano, hydroxy, halo, (C1-C6)alkoxy, (C1-C6)alkylthio, thiol, nitro, and the like. By "substituted aryl" is meant that one or more hydrogens on the aryl ring are replaced with one or more substituent groups, such as, but not limited to, cyano, hydroxy, halo, (C1-C6)alkoxy, (C1-C6)alkyl, (C2-C6)alkenyl, (C1-C6) alkylthio, thiol, nitro, and the like. "Aryl" includes carbocyclic and heterocyclic aromatic systems, such as, but not limited to, phenyl, naphthyl and the like.

In general, the total amount of leveling agents in the electroplating bath is from 0.5 ppm to 10000 ppm based on the total weight of the plating bath. The leveling agents according to the present invention are typically used in a total amount of from about 0.1 ppm to about 1000 ppm based on the total weight of the plating bath and more typically from 1 to 100 ppm, although greater or lesser amounts may be used.

The electroplating baths according to the present invention may include one or more optional additives. Such optional additives include, but are not limited to, accelerators, suppressors, surfactants and the like. Such suppressors and accelerators are generally known in the art. It will be clear to one skilled in the art which suppressors and/or accelerators to use and in what amounts.

A large variety of additives may typically be used in the bath to provide desired surface finishes for the Cu plated metal. Usually more than one additive is used with each additive forming a desired function. Advantageously, the electroplating baths may contain one or more of accelerators, suppressors, sources of halide ions, grain refiners and mixtures thereof. Most preferably the electroplating bath contains both, an accelerator and a suppressor in addition to the leveling agent according to the present invention. Other additives may also be suitably used in the present electroplating baths.

Any accelerators may be advantageously used in the present invention. Accelerators useful in the present invention include, but are not limited to, compounds comprising one or more sulphur atom and a sulfonic/phosphonic acid or their salts.

The generally preferred accelerators have the general structure $MO_3X—R^{11}—(S)_n—R^{12}$, with:

M is a hydrogen or an alkali metal (preferably Na or K)
X is P or S
n=1 to 6
$R^{11}$ is selected from C1-C8 alkyl group or heteroalkyl group, an aryl group or a heteroaromatic group. Heteroalkyl groups will have one or more heteroatom (N, S, O) and 1-12 carbons. Carbocyclic aryl groups are typical aryl groups, such as phenyl, naphtyl. Heteroaromatic groups are also suitable aryl groups and contain one or more N, O or S atom and 1-3 separate or fused rings.
$R^{12}$ is selected from H or (—S—$R^{11'}XO_3M$), with $R^{11'}$ being identical or different from $R^{11}$.

More specifically, useful accelerators include those of the following formulae:

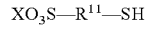

$XO_3S—R^{11}—SH$

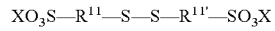

$XO_3S—R^{11}—S—S—R^{11'}—SO_3X$

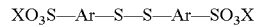

$XO_3S—Ar—S—S—Ar—SO_3X$ with $R^{11}$ as defined above and Ar is Aryl.

Particularly preferred accelerating agents are:
SPS: bis-(3-sulfopropyl)-disulfide disodium salt
MPS: 3-mercapto-1-propansulfonic acid, sodium salt Other examples of accelerators, used alone or in mixture, include, but are not limited to: MES (2-Mercaptoethanesulfonic acid, sodium salt); DPS (N,N-dimethyldithiocarbamic acid (3-sulfopropylester), sodium salt); UPS (3-[(amino-iminomethyl)-thio]-1-propylsulfonic acid); ZPS (3-(2-benzthiazolylthio)-1-propanesulfonic acid, sodium salt); 3-mercapto-propylsulfonicacid-(3-sulfopropyl)ester; methyl-($\overline{\omega}$-sulphopropyl)-disulfide, disodium salt; methyl-($\overline{\omega}$-sulphopropyl)-trisulfide, disodium salt.

Such accelerators are typically used in an amount of about 0.1 ppm to about 3000 ppm, based on the total weight of the plating bath. Particularly suitable amounts of accelerator useful in the present invention are 1 to 500 ppm, and more particularly 2 to 100 ppm.

Any suppressor may be advantageously used in the present invention. Suppressors useful in the present invention include, but are not limited to, polymeric materials, particularly those having heteroatom substitution, and more particularly oxygen substitution. It is preferred that the suppressor is a polyalkyleneoxide. Suitable suppressors include polyethylene glycol copolymers, particularly polyethylene glycol polypropylene glycol copolymers. The arrangement of ethylene oxide and propylene oxide of suitable suppressors may be block, gradient, or random. The polyalkylene glycol may comprise further alkylene oxide building blocks such as butylene oxide. Preferably, the average molecular weight of suitable suppressors exceeds about 2000 g/mol. The starting molecules of suitable polyalkylene glycol may be alkyl alcohols such as methanol, ethanol, propanol, n-butanol and the like, aryl alcohols such as phenols and bisphenols, alkaryl alcohols such as benzyl alcohol, polyol starters such as glycol, glycerin, trimethylol propane, pentaerythritol, sorbitol, carbohydrates such as saccharose, and the like, amines and oligoamines such as alkyl amines, aryl amines such as aniline, triethanol amine, ethylene diamine, and the like, amides, lactams, heterocyclic amines such as imidazol and carboxylic acids. Optionally, polyalkylene glycol suppressors may be functionalized by ionic groups such as sulfate, sulfonate, ammonium, and the like.

When suppressors are used, they are typically present in an amount in the range of from about 1 to about 10,000 ppm based on the weight of the bath, and preferably from about 5 to about 10,000 ppm.

The present invention is useful for depositing a metal layer, particularly a copper layer, on a variety of substrates, particularly those having variously sized apertures. For example, the present invention is particularly suitable for depositing copper on integrated circuit substrates, such as semiconductor devices, with small diameter vias, trenches or other apertures. In one embodiment, semiconductor devices are plated according to the present invention. Such semiconductor devices include, but are not limited to, wafers used in the manufacture of integrated circuits.

The general process of copper electrodeposition on semiconductor integrated circuit substrates is described with respect to FIGS. 1 and 2 without restricting the invention thereto.

Figure 1B:
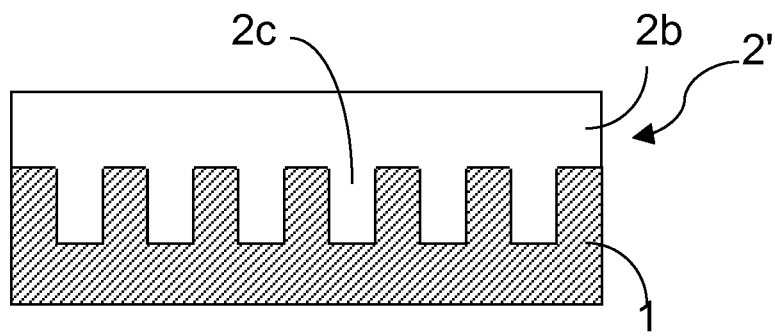
FIG. 1b: Electrodeposition of a copper layer 2' onto the dielectric substrate 1 such that the trenches 2c of the substrate 1 are filled and an overplating of copper 2b is generated on top of the whole structured substrate.
Figure 1C:
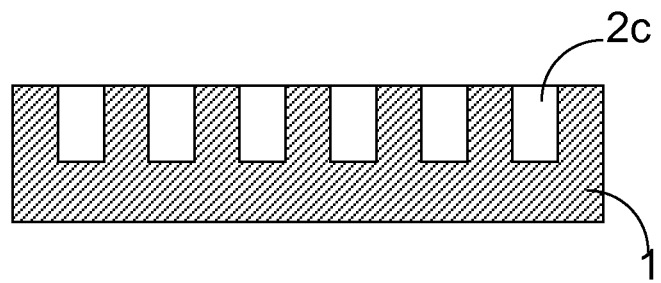
FIG. 1c: After optional annealing, the overburden of copper 2b is removed by chemical mechanical planarization (CMP).

FIG. 1a shows a dielectric substrate 1 seeded with a copper layer 2a. With reference to FIG. 1b a copper layer 2' is deposited onto the dielectric substrate 1 by electrodeposition. The trenches 2c of the substrate 1 are filled and an overplating of copper 2b, also referred to as "overburden", is generated on top of the whole structured substrate. During the process, after optional annealing, the overburden of copper 2b is removed by chemical mechanical planarization (CMP), as depicted in FIG. 1c.

Figure 2A:
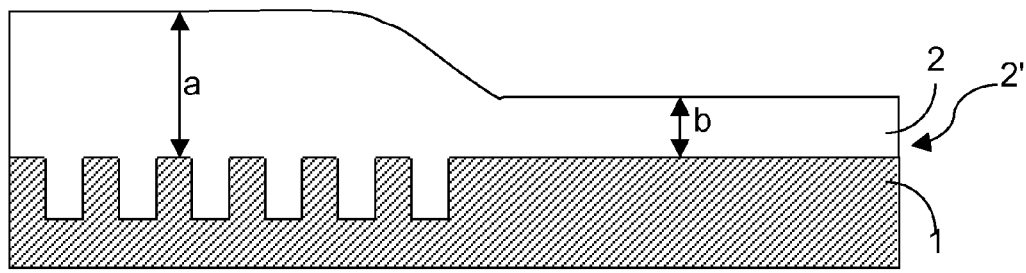
FIG. 2a: Without a leveling agent electrodeposition leads to a high ratio a/b>>1 or mounding.
Figure 2B:
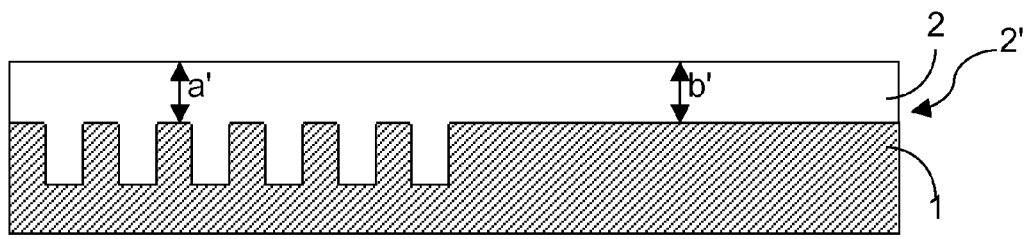
FIG. 2b: With a leveling agent, the ratio a/b is reduced to a value as close as possible to 1.

The effect of a leveling agent is generally described with respect to FIGS. 2a and 2b.

Without a leveling agent the deposition leads to a high ratio a/b>>1, the so called mounding. In contrast, the aim is to reduce the ratio a/b to a value, which is as close as possible to 1.

A particular advantage of the present invention is that overplating, particularly mounding, is reduced or substantially eliminated. Such reduced overplating means less time and effort is spent in removing metal, such as copper, during subsequent chemical-mechanical planarization (CMP) processes, particularly in semiconductor manufacture. A further advantage of the present invention is that a wide range of apertures sizes may be filled within a single substrate resulting in a substantially even surface having a ratio a/b of 1.5 or less, preferably 1.2 or less, most preferably 1.1 or less. Thus, the present invention is particularly suitable to evenly filling apertures in a substrate having a variety of aperture sizes, such as from 0.01 micrometer to 100 micrometer or even larger.

A further significant advantage of this leveling effect is that less material has to be removed in post-deposition operations. For example, chemical mechanical planarization (CMP) is used to reveal the underlying features. The more level deposit of the invention corresponds to a reduction in the amount of metal which must be deposited, therefore resulting in less removal later by CMP. There is a reduction in the amount of scrapped metal and, more significantly, a reduction in the time required for the CMP operation. The material removal operation is also less severe which, coupled with the reduced duration, corresponds to a reduction in the tendency of the material removal operation to impart defects.

Typically, substrates are electroplated by contacting the substrate with the plating baths of the present invention. The substrate typically functions as the cathode. The plating bath contains an anode, which may be soluble or insoluble. Optionally, cathode and anode may be separated by a membrane. Potential is typically applied to the cathode. Sufficient current density is applied and plating performed for a period of time sufficient to deposit a metal layer, such as a copper layer, having a desired thickness on the substrate. Suitable current densities, include, but are not limited to, the range of 1 to 250 mA/cm$^2$. Typically, the current density is in the range of 1 to 60 mA/cm$^2$ when used to deposit copper in the manufacture of integrated circuits. The specific current density depends upon the substrate to be plated, the leveling agent selected and the like. Such current density choice is within the abilities of those skilled in the art. The applied current may be a direct current (DC), a pulse current (PC), a pulse reverse current (PRC) or other suitable current.

In general, when the present invention is used to deposit metal on a substrate such as a wafer used in the manufacture of an integrated circuit, the plating baths are agitated during use. Any suitable agitation method may be used with the present invention and such methods are well-known in the art. Suitable agitation methods include, but are not limited to, inert gas or air sparging, work piece agitation, impingement and the like. Such methods are known to those skilled in the art. When the present invention is used to plate an integrated circuit substrate, such as a wafer, the wafer may be rotated such as from 1 to 150 RPM and the plating solution contacts the rotating wafer, such as by pumping or spraying. In the alternative, the wafer need not be rotated where the flow of the plating bath is sufficient to provide the desired metal deposit.

Metal, particularly copper, is deposited in apertures according to the present invention without substantially forming voids within the metal deposit. By the term "without substantially forming voids", it is meant that 95% of the plated apertures are void-free. It is preferred that the plated apertures are void-free.

While the process of the present invention has been generally described with reference to semiconductor manufacture, it will be appreciated that the present invention may be useful in any electrolytic process where an essentially level or planar copper deposit having high reflectivity is desired, and where reduced overplating and metal filled small features that are substantially free of voids are desired. Such processes include printed wiring board manufacture. For example, the present plating baths may be useful for the plating of vias, pads or traces on a printed wiring board, as well as for bump plating on wafers. Other suitable processes include packaging and interconnect manufacture. Accordingly, suitable substrates include lead frames, interconnects, printed wiring boards, and the like.

Plating equipment for plating semiconductor substrates are well known. Plating equipment comprises an electroplating tank which holds Cu electrolyte and which is made of a suitable material such as plastic or other material inert to the electrolytic plating solution. The tank may be cylindrical, especially for wafer plating. A cathode is horizontally disposed at the upper part of tank and may be any type substrate such as a silicon wafer having openings such as trenches and vias. The wafer substrate is typically coated with a seed layer of Cu or other metal to initiate plating thereon. A Cu seed layer may be applied by chemical vapor deposition (CVD), physical vapor deposition (PVD), or the like. An anode is also preferably circular for wafer plating and is horizontally disposed at the lower part of tank forming a space between the anode and cathode. The anode is typically a soluble anode.

These bath additives are useful in combination with membrane technology being developed by various tool manufacturers. In this system, the anode may be isolated from the organic bath additives by a membrane. The purpose of the separation of the anode and the organic bath additives is to minimize the oxidation of the organic bath additives.

The cathode substrate and anode are electrically connected by wiring and, respectively, to a rectifier (power supply). The cathode substrate for direct or pulse current has a net negative charge so that Cu ions in the solution are reduced at the cathode substrate forming plated Cu metal on the cathode surface. An oxidation reaction takes place at the anode. The cathode and anode may be horizontally or vertically disposed in the tank.

Metal, particularly copper, is deposited in apertures according to the present invention without substantially forming voids within the metal deposit. By the term "without substantially forming voids", it is meant that 95% of the plated apertures are void-free. It is preferred that the plated apertures are void-free.

While the process of the present invention has been generally described with reference to semiconductor manufacture, it will be appreciated that the present invention may be useful in any electrolytic process where an essentially level or planar copper deposit having high reflectivity is desired. Accordingly, suitable substrates include lead frames, interconnects, printed wiring boards, and the like.

All percent, ppm or comparable values refer to the weight with respect to the total weight of the respective composition except where otherwise indicated. All cited documents are incorporated herein by reference.

The following examples shall further illustrate the present invention without restricting the scope of this invention.

EXAMPLES

The Amine number was determined according to DIN 53176 by titration of a solution of the polymer in acetic acid with perchloric acid.

The Hydroxy number was determined according to DIN 53240 by heating the sample in pyridine with acetic acid anhydride and acetic acid, followed by titration with potassium hydroxide.

The Molecular weight (Mn) was determined by size exclusion chromatography with hexafluoroisopropanol as eluent.

The viscosity of the pure polymers was measured with a rotary viscometer (Haake) at 20 degree C.

Example 1

Polyalkanolamines (II) were synthesized in analogy to the method described in the literature (e. g. EP 0 441 198, U.S. Pat. No. 5,393,463) by condensation in presence of hypophosphorous acid by the following procedure:

A mixture of 1491.9 g triethanolamine and 9.7 g of an aqueous solution of hypophosphorous acid (50% strength) was heated to 227 degrees C. with stirring under a weak stream of nitrogen. The generated water was distilled off. After 4.3 hours the mixture was cooled to room temperature. A slightly yellow liquid having a viscosity of 3990 mPas and a hydroxy number of 611.5 mg (KOH)/g was obtained. The resulting polytriethanolamine showed a weight average molecular weight of Mw=6700 g/mol and a polydispersity of Mw/Mn=2.0. The reaction product was dissolved in DI water to give a 10 wt % solution.

Comparative Example 2

Prior Art

A copper plating bath was prepared by combining 40 g/l copper as copper sulfate, 10 g/l sulfuric acid, 0.050 g/l chloride ion as HCl, 0.100 g/l of an EO/PO copolymer suppressor, and 0.028 g/l of SPS and DI water. The EO/PO copolymer suppressor had a molecular weight of <5000 g/mole and terminal hydroxyl groups.

A copper layer was electroplated onto a wafer substrate by contacting the wafer substrate with the above described plating bath at 25 degrees C. applying a direct current of −5 mA/cm$^2$ for 120 s followed by −10 mA/cm$^2$ for 60 s. The thus electroplated copper layer was investigated by SEM inspection.

Figure 3A:
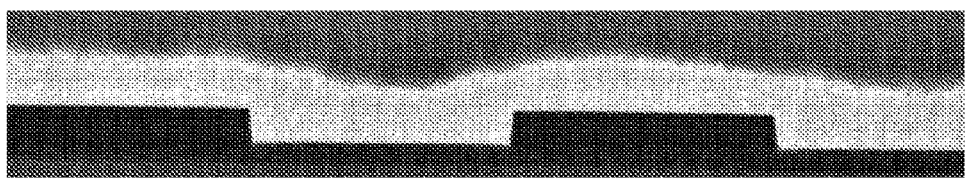
FIG. 3a: A scanning electron micrograph (SEM) image of an electrodeposited copper layer according to the prior art (without a leveling agent) on a substrate with trenches having a 2.0 micrometer width.
Figure 3B:
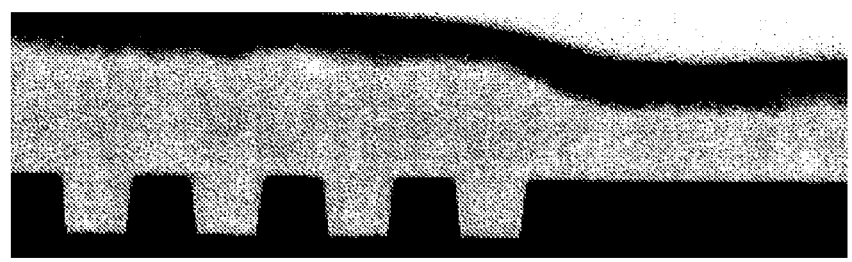
FIG. 3b: An SEM image of an electrodeposited copper layer according to the prior art (without a leveling agent) on a substrate with trenches having a 0.250 micrometer width.
Figure 3C:
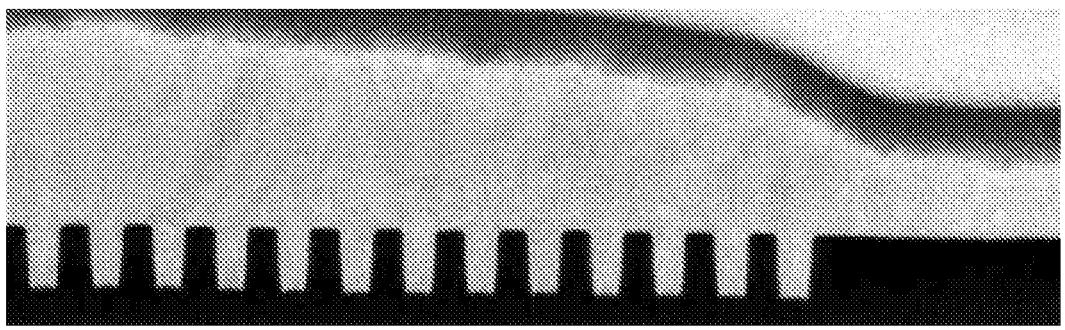
FIG. 3c: An SEM image of an electrodeposited copper layer according to the prior art (without a leveling agent) on a substrate with trenches having a 0.130 micrometer width.

The results without using a leveling agent are shown in FIGS. 3a, 3b and 3c for substrates having structures of different aperture sizes. FIG. 3a shows a scanning electron micrograph (SEM) image of a trench of 2.0 micrometer width. FIG. 3b shows an SEM image of a trenches having 0.250 micrometer width and FIG. 3c shows a SEM image of a substrate provided with trenches of 0.130 micrometer width. Both, FIGS. 3b and 3c exhibit a very strong mounding over the 0.250 and 0.130 micrometer trenches, respectively.

Example 3

The procedure of example 2 was repeated except that 0.100 ml/l of the leveler prepared in example 1 was added to the plating bath.

A copper layer was electroplated onto a wafer substrate as described in example 2. The thus electroplated copper layer was investigated by SEM inspection.

Figure 4A:
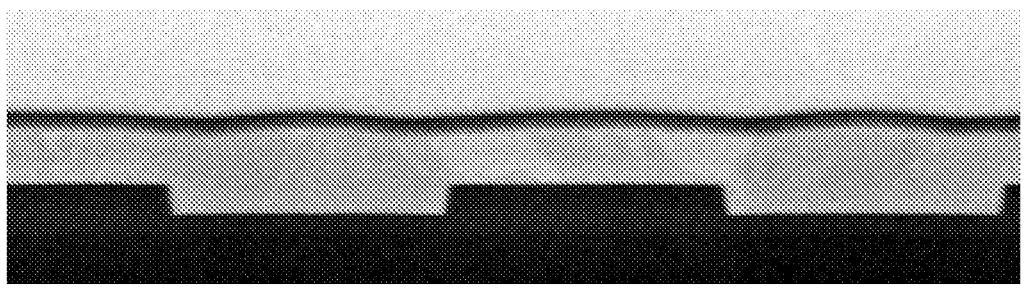
FIG. 4a: An SEM image of an electrodeposited copper layer with a leveling agent according to the present invention on a substrate with trenches having a 2.0 micrometer width.
Figure 4B:
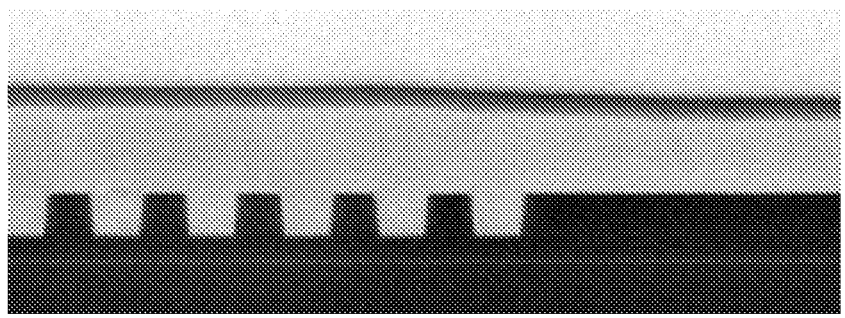
FIG. 4b: An SEM image of an electrodeposited copper layer with a leveling agent according to the present invention on a substrate with trenches having a 0.250 micrometer width.
Figure 4C:
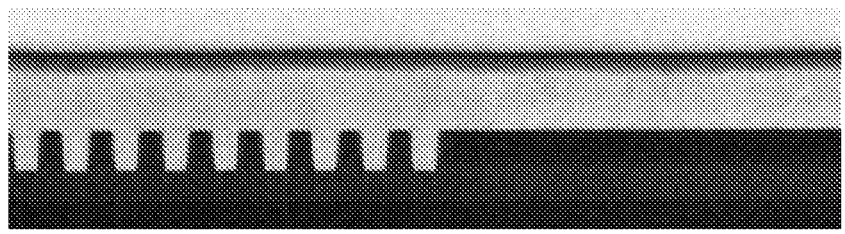
FIG. 4c: An SEM image of an electrodeposited copper layer with a leveling agent according to the present invention on a substrate with trenches having a 0.130 micrometer width.

The results using a plating bath with a leveling agent according to the present invention are shown in FIGS. 4a, 4b and 4c for different aperture sizes. FIG. 4a shows a scanning electron micrograph (SEM) image of trenches of 2.0 micrometer width. FIG. 4b shows an SEM image of trenches of 0.250 micrometer width and FIG. 4c shows an SEM image of trenches of 0.130 micrometer width. FIGS. 4a, 4b, and 4c show very even surfaces independent of the dimension of the trenches, i.e. the ratio a/b is very close to 1, as depicted in FIG. 2b. In addition to the reduced mounding the filling of the 2.0 micrometer trenches is much better than without the leveling agent.

Example 4

The leveler prepared in example 1 (20.0 g) and water (145.6 g) were placed into a 250 ml flask and dimethyl sulfate (16.4 g) was added drop-wise into the solution at room temperature. The reaction mixture was stirred for 22 h at room temperature. The resulting yellow solution showed an amine number of 0 mmol/g, indicating complete quaternization of all amine atoms present in the polytriethanolamine starting material. The aqueous solution of the leveler showed a water content of 86.3%.

Example 5

The leveler prepared in example 1 (40.0 g) and potassium-tert-butylate (2.44 g) were placed into a 250 ml flask and heated to 160 degree C. under a nitrogen atmosphere. After 30 min glycerine carbonate (51.5 g) was added drop-wise during 45 min. The reaction mixture was heated for further 3 h 50 min and, then, it was cooled to room temperature. A black viscous liquid having a hydroxy number of 581.6 mg (KOH)/g was obtained. The resulting polytriethanolamine alkoxylate leveler showed a weight average molecular weight of Mw=16600 g/mol and a polydispersity of Mw/Mn=2.4.

Example 6

The leveler prepared in example 1 (202.1 g) and an aqueous solution of potassium hydroxide (concentration: 50 weight percent; 3.5 g) were placed into a 1 l round bottom flask and the resulting water was removed at 100 degree C. and 1 mbar for during 4 h at the rotary evaporator. Then, the mixture was placed into a 2 l autoclave. The reactor was purged with nitrogen three times at 5 bars. Then, propylene oxide (128.0 g) was added in portions at 130 degree C. over a period of 2 h. To complete the reaction, the mixture was allowed to post-react overnight at the same temperature. Volatile organic compounds were removed by a constant nitrogen stream and the resulting product was cooled to room temperature. Leveler L4 was obtained as a dark brown liquid (326.1 g) having a hydroxy number of 368.6 mg (KOH)/g and an amine number of 4.53 mmol/g.

Example 7

The leveler prepared in example 1 (233.2 g) and an aqueous solution of potassium hydroxide (concentration: 50 weight percent; 3.5 g) were placed into a 1 l round bottom flask and the resulting water was removed at 100 degree C. and 1 mbar for during 4 h at the rotary evaporator. Then, the mixture was placed into a 2 l autoclave. The reactor was purged with nitrogen three times at 5 bars. Then, butylene oxide (183.3 g) was added in portions at 140 degree C. over a period of 3 h. To complete the reaction, the mixture was allowed to post-react overnight at the same temperature. Volatile organic compounds were removed by a constant nitrogen stream and the resulting product was cooled to room temperature. Leveler L5 was obtained as a dark brown liquid (411.4 g) having a hydroxy number of 358 mg (KOH)/g and an amine number of 4.46 mmol/g. L5 showed a weight average molecular weight of Mw=9000 g/mol and a polydispersity of Mw/Mn=1.6.

Example 8

The leveler prepared in example 7 (50.0 g), water (100.0 g) and benzyl chloride (56.4 g) were placed into a 500 ml flask and heated at 80 degree C. for 6 h. Then, the reaction mixture was cooled and poured into a separation funnel. The aqueous phase was separated and washed three times with dichloromethane. Residual amounts of dichloromethane in the aqueous phase were removed at the rotary evaporator at 80 degree C. at 150 mbar for 2 h. Leveler L6 was obtained as a clear yellow aqueous solution (142.3 g). The amine number of L6 equaled 0 mmol/g, indicating complete quaternization of all amine atoms present in the polyamine starting material. The product showed a water content of 53.5%.

Example 9

A mixture of triethanolamine (1506 g) and an aqueous solution of hypophosphorous acid (50% strength, 9.8 g) was heated to 227 degrees C. with stirring under a weak stream of nitrogen. The generated water was distilled off. After 7.5 hours the mixture was cooled to room temperature. Residual amounts of water were removed at the rotary evaporator at 100 degree C. and 25-35 mbar for 2 h. A brown oil having a viscosity of 11400 mPas and a hydroxy number of 463.5 mg (KOH)/g was obtained. The resulting polytriethanolamine showed a weight average molecular weight of Mw=17700 g/mol and a polydispersity of Mw/Mn=3.5. This intermediate product (119.0 g) and an aqueous solution of potassium hydroxide (concentration: 50 weight percent; 1.8 g) were placed into a 1 l round bottom flask and the resulting water was removed at 100 degree C. and 1 mbar for during 4 h at the rotary evaporator. Then, the mixture was placed into a 2 l autoclave. The reactor was purged with nitrogen three times at 5 bars. Then, ethylene oxide (43.3 g) was added in portions at 120 degree C. over a period of 15 min. To complete the reaction, the mixture was allowed to postreact overnight at the same temperature. Volatile organic compounds were removed by a constant nitrogen stream and the resulting product was cooled to room temperature. Leveler L7 was obtained as a dark brown liquid (149.7 g) having a hydroxy number of 358 mg (KOH)/g and an amine number of 5.67 mmol/g.

Comparative Example 10

Prior Art

A copper plating bath was prepared as described in comparative example 2.

A copper layer was electroplated onto a structured silicon wafer purchased from SKW Associate Inc. containing trenches. These trenches varied in width ranging from 130 nm to several micrometers with a depth of approximately 250 nm and a separation ranging from 130 nm to several micrometers. Such wafer substrates were brought into contact with the above described plating bath at 25 degrees C. and a direct current of −5 mA/cm2 for 120 s followed by −10 mA/cm2 for 60 s was applied.

The thus electroplated copper layer was investigated by profilometry inspection with a Dektak 3, Veeco Instruments Inc. In the case of 130 nm and 250 nm feature sizes a field of nested wires was scanned and the height difference between the unstructured and structured area was measured.

Figure 5A:
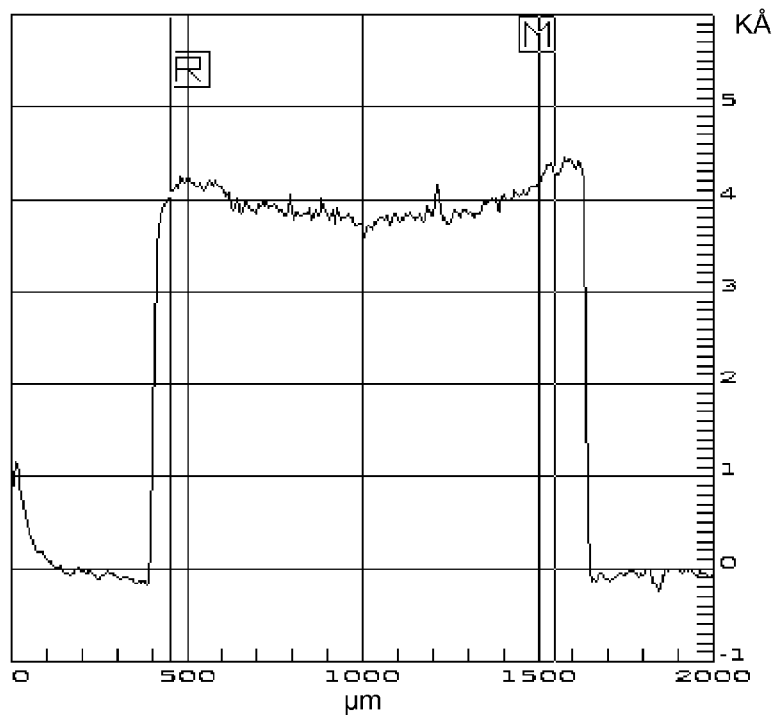
FIG. 5a: A profilometry cross-sectional scan of nested trenches having 0.130 micrometer width with a separation of 0.130 micrometer on a copper layer electrodeposited without a leveling agent.
Figure 5B:
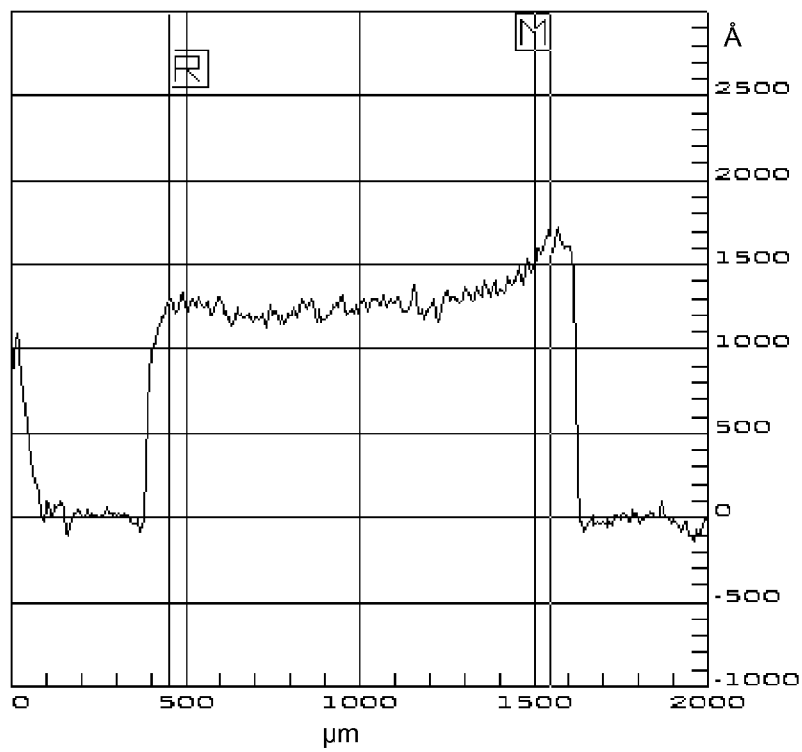
FIG. 5b: A profilometry cross-sectional scan of nested trenches having 0.250 micrometer width with a separation of 0.250 micrometer on a copper layer electrodeposited without a leveling agent.

The results without using a leveling agent are shown in FIGS. 5a and 5b and show a profilometry cross-sectional scan of nested trenches having 0.130 micrometer width with a separation of 0.130 micrometer (FIG. 5a), respectively a cross-sectional scan of 0.250 micrometer features (FIG. 5b). Both, FIGS. 5a and 5b show a higher copper deposition rate on the structured area in contrast to the unstructured area. This phenomenon is well known as mounding and is strongly pronounced over the 0.130 and 0.250 micrometer trenches. The measured values for the 0.130 micrometer and 0.250 micrometer features are depicted in table 1.

Example 11

The procedure of example 10 was repeated except that 1 ml/l of a stock solution containing 1% (w/w) of the active leveling agent of example 1 was added to the plating bath.

A copper layer was electroplated onto a wafer substrate as described in example 10. The thus electroplated copper layer was investigated by profilometry as described in example 10.

Figure 6A:
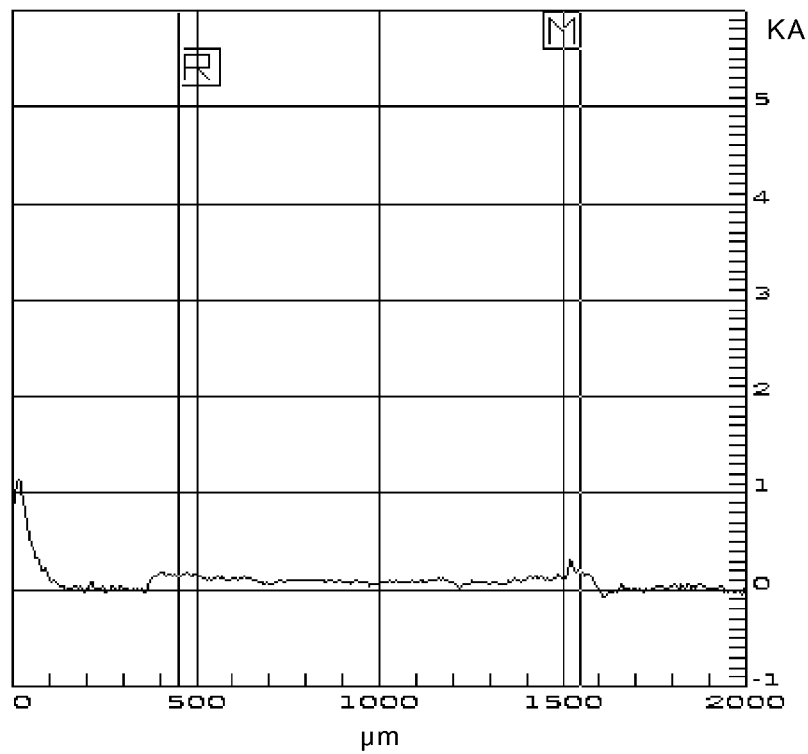
FIG. 6a: A profilometry cross-sectional scan of nested trenches having 0.130 micrometer width with a separation of 0.130 micrometer on a copper layer electrodeposited with a leveling agent according to the present invention.
Figure 6B:
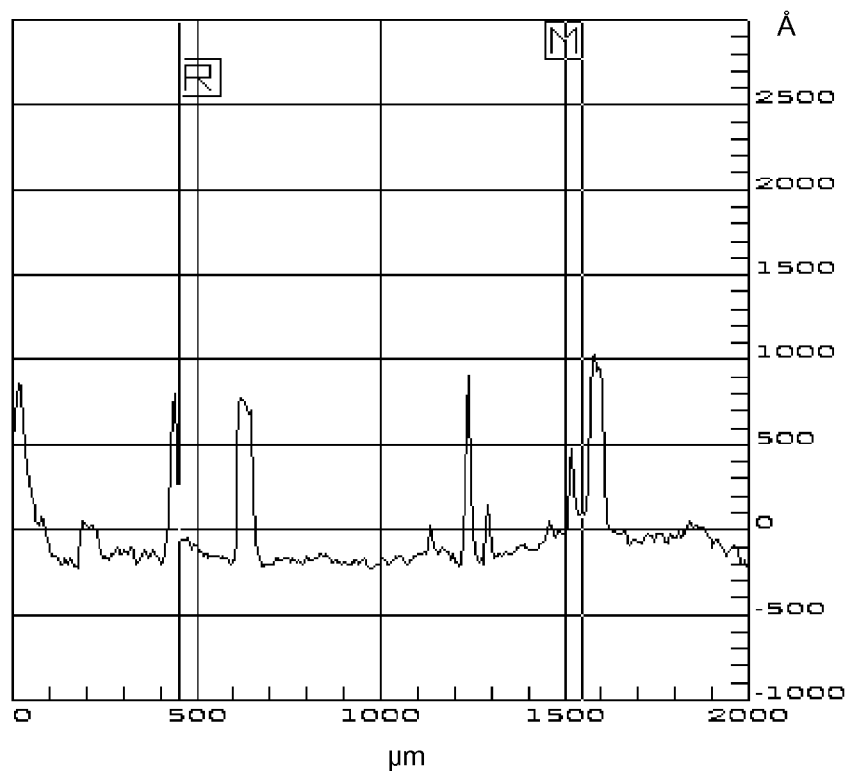
FIG. 6b: A profilometry cross-sectional scan of nested trenches having 0.250 micrometer width with a separation of 0.250 micrometer on a copper layer electrodeposited with a leveling agent according to the present invention.

The results using a plating bath with a leveling agent according to the present invention are shown in FIGS. 6a and 6b for different trench sizes. The profilometry cross-sectional scan of nested trenches having 0.130 micrometer width with a separation of 0.130 μm (FIG. 6a), respectively a cross-sectional scan of 0.250 micrometer features (FIG. 6b) show a significant reduction of the mounding compared to prior art. The measured values are depicted in table 1.

Example 12

The procedure of example 10 was repeated except that 1 ml/l of a stock solution containing 1% (w/w) of the active leveling agent of example 4 was added to the plating bath.

A copper layer was electroplated onto a wafer substrate as described in example 10. The thus electroplated copper layer was investigated by profilometry as described in example 10.

The values obtained from profilometry, as depicted in table 1, show a significant reduction of the mounding compared to example 10 without a leveling agent.

Example 13

The procedure of example 10 was repeated except that 1 ml/l of a stock solution containing 1% (w/w) of the active leveling agent of example 5 was added to the plating bath.

A copper layer was electroplated onto a wafer substrate as described in example 10. The thus electroplated copper layer was investigated by profilometry as described in example 10.

The values obtained from profilometry, as depicted in table 1, show a significant reduction of the mounding compared to example 10 without a leveling agent.

Example 14

The procedure of example 10 was repeated except that 1 ml/l of a stock solution containing 1% (w/w) of the active leveling agent of example 6 was added to the plating bath.

A copper layer was electroplated onto a wafer substrate as described in example 10.

The thus electroplated copper layer was investigated by profilometry as described in example 10.

The values obtained from profilometry, as depicted in table 1, show a significant reduction of the mounding compared to example 10 without a leveling agent.

Example 15

The procedure of example 10 was repeated except that 1 ml/l of a stock solution containing 1% (w/w) of the active leveling agent of example 7 was added to the plating bath.

A copper layer was electroplated onto a wafer substrate as described in example 10. The thus electroplated copper layer was investigated by profilometry as described in example 10.

The values obtained from profilometry, as depicted in table 1, show a significant reduction of the mounding compared to example 10 without a leveling agent.

Example 16

The procedure of example 10 was repeated except that 1 ml/l of a stock solution containing 1% (w/w) of the active leveling agent of example 8 was added to the plating bath.

A copper layer was electroplated onto a wafer substrate as described in example 10. The thus electroplated copper layer was investigated by profilometry as described in example 10.

The values obtained from profilometry, as depicted in table 1, show a significant reduction of the mounding compared to example 10 without a leveling agent.

Example 17

The procedure of example 10 was repeated except that 1 ml/l of a stock solution containing 1% (w/w) of the active leveling agent of example 9 was added to the plating bath.

A copper layer was electroplated onto a wafer substrate as described in example 10. The thus electroplated copper layer was investigated by profilometry as described in example 10.

The values obtained from profilometry, as depicted in table 1, show a significant reduction of the mounding compared to example 10 without a leveling agent.

TABLE 1

| Leveler | mounding | |
|---|---|---|
| | 0.130 micrometer | 0.250 micrometer |
| comparative example 10 | 370 nm | 123 nm |
| example 11 | 8 nm | −8 nm |
| example 12 | 106 nm | 26 nm |
| example 13 | 58 nm | 4 nm |
| example 14 | 129 nm | 41 nm |
| example 15 | 102 nm | 44 nm |
| example 16 | 135 nm | 48 nm |
| example 17 | 19 nm | −5 nm |

The invention claimed is:

1. A composition, comprising:
(A) a source of at least one metal ion; and
(B) at least one leveling agent obtained by condensing at least one selected from the group consisting of
a trialkanolamine of formula (Ia)

$$N(R^1\text{—}OH)_3 \qquad (Ia),\text{ and}$$

a dialkanolamine of formula (Ib)

$$R^2\text{—}N(R^1\text{—}OH)_2 \qquad (Ib),$$

to give a polyalkanolamine(II), wherein
the $R^1$ radicals are each independently a divalent, linear, or branched aliphatic hydrocarbon radical having from 2 to 6 carbon atoms, and
the $R^2$ radicals are each hydrogen, a linear aliphatic, a branched aliphatic, a cycloaliphatic, or aromatic hydrocarbon radical having from 1 to 30 carbon atoms,
or at least one derivative obtained by alkoxylation, substitution, or alkoxylation and substitution of the polyalkanolamine (II).

2. The composition of claim 1, wherein the at least one metal ion comprises a copper ion.

3. The composition of claim 1, wherein the leveling agent is an alkoxylated polyalkanolamine obtained by alkoxylating the polyalkanolamine (II) with at least one $C_2$- to $C_{12}$-alkylene oxide, styrene oxide, glycidol, or at least one glycidyl ether.

4. The composition of claim 3, wherein the alkylene oxide employed and is at least one selected from the group consisting of ethylene oxide, propylene oxide, and butylene oxide.

5. The composition of claim 3, wherein a degree of alkoxylation of the alkoxylated polyalkanolamine is from 0.1 to 200.

6. The composition of claim 1, wherein the substitution of the polyalkanolamine(II) is carried out and is at least one selected from the group consisting of a quaternization, a protonation, an alkylation, a sulphatation, and a phosphatation.

7. The composition of claim 1, wherein the leveling agent is obtained by co-condensing a compound selected from the group consisting of N-hydroxyalkylamines of formulae (Ia) and (Ib), with at least one compound (Ic) comprising two hydroxyl groups, or two amino groups, or a hydroxyl and an amino group.

8. The composition of claim 7, wherein the at least one compound (Ic) is present in an amount of not more than 50% by weight, based on an amount of all components of the condensing.

9. The composition of claim 1, wherein the derivative is present and is at least one polyoxyalkylene oxide having block, random, or gradient structure, or a combination thereof.

10. The composition of claim 1, wherein at least one of the trialkanolamine (Ia) is condensed and is selected from the group consisting of triethanolamine, triisopropanolamine, and tributan-2-olamine.

11. The composition of claim 1, further comprising an accelerating agent.

12. The composition of claim 1, further comprising a suppressing agent.

13. A bath, comprising at least one leveling agent obtained by condensing at least one selected from the group consisting of a trialkanolamine of formula (Ia)

$$N(R^1\text{---}OH)_3 \quad \text{(Ia)},$$

and
a dialkanolamine of formula (Ib)

$$R^2\text{---}N(R^1\text{---}OH)_2 \quad \text{(Ib)},$$

to give a polyalkanolamine(II),
wherein
the $R^1$ radicals are each independently a divalent, linear, or branched aliphatic hydrocarbon radical having from 2 to 6 carbon atoms, and the $R^2$ radicals are each hydrogen, a linear aliphatic, a branched aliphatic, a cycloaliphatic, or aromatic hydrocarbon radical having from 1 to 30 carbon atoms, or at least one derivative obtained by alkoxylation, substitution, or alkoxylation and substitution of the polyalkanolamine (II);

and a source of at least one metal ion;

wherein the bath is suitable for depositing at least one metal comprising layer.

14. A process for depositing a metal layer on a substrate, the process comprising
  a) contacting a metal plating bath comprising the composition of claim 1 with the substrate, and
  b) applying a current density to the substrate for a time sufficient to deposit a metal layer onto the substrate.

15. The process of claim 14, wherein the substrate comprises at least one micrometer or submicrometer sized feature and the depositing is performed to fill the at least one micrometer or submicrometer sized feature.

16. The process of claim 15, wherein the at least one micrometer or submicrometer-sized feature has at least one selected from the group consisting of a size from 1 to 1000 nm and an aspect ratio of 4 or more.

17. The composition of claim 3, wherein a degree of alkoxylation of the alkoxylated polyalkanolamine is from 0.5 to 20.

18. The composition of claim 2, wherein the leveling agent is an alkoxylated polyalkanolamine obtained by alkoxylating the polyalkanolamine (II) with at least one $C_2$- to $C_{12}$-alkylene oxide, styrene oxide, glycidol, or at least one glycidyl ether.

19. The composition of claim 4, wherein a degree of alkoxylation of the alkoxylated polyalkanolamine is from 0.1 to 200.

20. The composition of claim 4, wherein a degree of alkoxylation of the alkoxylated polyalkanolamine is from 0.5 to 20.

* * * * *